(12) United States Patent
Low

(10) Patent No.: US 12,425,784 B2
(45) Date of Patent: Sep. 23, 2025

(54) HEARING DEVICE

(71) Applicant: Sivantos Pte. Ltd., Singapore (SG)

(72) Inventor: Keh Hoe Low, Singapore (SG)

(73) Assignee: Sivantos Pte. Ltd., Singapore (SG)

( * ) Notice: Subject to any disclaimer, the term of this patent is extended or adjusted under 35 U.S.C. 154(b) by 283 days.

(21) Appl. No.: 18/186,319

(22) Filed: Mar. 20, 2023

(65) Prior Publication Data

US 2023/0300546 A1    Sep. 21, 2023

(30) Foreign Application Priority Data

Mar. 21, 2022 (DE) ............... 10 2022 202 761.2

(51) Int. Cl.
*H04R 25/00* (2006.01)
*H05K 1/18* (2006.01)

(52) U.S. Cl.
CPC .......... *H04R 25/602* (2013.01); *H05K 1/181* (2013.01); *H04R 2225/021* (2013.01); *H04R 2225/51* (2013.01); *H05K 2201/09218* (2013.01)

(58) Field of Classification Search
CPC ............. H04R 25/602; H04R 225/021; H04R 2225/51; H05K 1/181; H05K 2201/09218
USPC .................................................. 381/312, 315
See application file for complete search history.

(56) References Cited

U.S. PATENT DOCUMENTS

| 7,782,010 | B2 | 8/2010 | Heerlein et al. | |
|---|---|---|---|---|
| 9,014,407 | B2 | 4/2015 | Boguslavskij et al. | |
| 2005/0244024 | A1 | 11/2005 | Fischer et al. | |
| 2017/0180884 | A1* | 6/2017 | Ozden | H04R 25/554 |
| 2017/0195801 | A1* | 7/2017 | Rucker | H04R 25/606 |
| 2019/0052980 | A1* | 2/2019 | Troelsen | H01Q 1/273 |
| 2019/0239005 | A1* | 8/2019 | Sandhu | H02J 7/00047 |
| 2020/0314566 | A1* | 10/2020 | Perri | H04R 25/554 |
| 2021/0306773 | A1 | 9/2021 | Kvist | |
| 2023/0109167 | A1* | 4/2023 | Petersen | H04R 25/407 |
| | | | | 381/315 |

FOREIGN PATENT DOCUMENTS

| DE | 102004017832 B3 | 10/2005 |
|---|---|---|
| DE | 102006026753 B3 | 12/2007 |
| DE | 102012214466 A1 | 12/2013 |
| DE | 102021201095 A1 | 6/2021 |

* cited by examiner

*Primary Examiner* — William J Deane, Jr.
(74) *Attorney, Agent, or Firm* — Laurence A. Greenberg

(57) ABSTRACT

A hearing device has a printed circuit board on which a battery module is fastened. The battery module has a battery cell with a case, an antenna being integrated into the case. The hearing device further has a printed circuit board, on which a battery module is fastened. In particular, the printed circuit board is configured to be rigid, and is manufactured from a glass fiber-reinforced epoxy resin.

6 Claims, 2 Drawing Sheets

HEARING DEVICE

CROSS-REFERENCE TO RELATED APPLICATION

This application claims the priority, under 35 U.S.C. § 119, of German Patent Application DE 10 2022 202 761.2, filed Mar. 21, 2022; the prior application is herewith incorporated by reference in its entirety.

FIELD AND BACKGROUND OF THE INVENTION

The invention relates to a hearing device. The hearing device has a printed circuit board, a battery cell and an antenna.

Persons who suffer from a reduction of hearing ability conventionally use a hearing aid. Ambient sound is in this case converted into an electrical (audio/sound) signal, usually by means of a microphone, that is to say an electromechanical sound transducer, so that the electrical signal is registered. The registered electrical signals are processed by means of an amplifier circuit, and introduced by means of a further electromechanical transducer in the form of a receiver into the person's auditory canal. The processing of the registered sound signals is usually also carried out, for which purpose a signal processor of the amplifier circuit is conventionally used. The gain is matched to any hearing loss of the hearing device wearer. The (sound) transducers and the amplifier circuit are conventionally arranged in a case and thereby at least partially protected from environmental influences.

The control of the functions of the hearing device is carried out, for example, by means of a manually operated switch introduced into the case. It is consequently necessary for the case to have a particular minimum size so that the hearing device is comparatively visible. To remedy this, it is known to control the hearing device by means of a further device, such as a remote control or a smartphone, a radio link being set up between the further device and the hearing device. For this purpose, it is necessary for the hearing device to have a radio apparatus which is connected to an antenna. Audio signals may furthermore additionally be received by means of the radio apparatus, so that they can be fed into the person's auditory canal. The functional scope of the hearing device is therefore increased.

The antenna is provided for example by means of a coil that is fastened on a printed circuit board, by means of which the amplifier circuit is also at least partially produced. The required installation space is consequently again increased. Additional components which are mounted on the printed circuit board are also necessary, so that the production time is lengthened. As an alternative thereto, a conductive trace of the printed circuit board may for example also be used as an antenna. An additional component is consequently not needed, but the space requirement is increased further in comparison with the use of the coil.

SUMMARY OF THE INVENTION

The object of the invention is to provide a particularly suitable hearing device, in particular with the overall size being reduced and/or assembly being simplified.

According to the invention, this object is achieved by the features of the independent claim. The dependent claims relate to advantageous developments and configurations.

With the foregoing and other objects in view there is provided, in accordance with the invention, a hearing device containing a battery module having a battery cell with a case, a printed circuit board on which the battery module, which has the battery cell with the case, is fastened, and an antenna being integrated into the case.

For example, the hearing device is a head-worn device or comprises a head-worn device, and the hearing device is for example a headset. Particularly preferably, however, the hearing device is a hearing aid. Hearing aids are used to assist persons suffering from a reduction of hearing ability. In other words, the hearing aid is a medical device by means of which, for example, partial hearing loss is compensated for. The hearing aid is for example a receiver-in-the-canal hearing aid (RIC), an in-the-ear hearing aid, an in-the-canal hearing aid (ITC) or a complete-in-canal hearing aid (CIC), hearing-aid spectacles, a pocket hearing aid, a bone-conduction hearing aid or an implant. Particularly preferably, the hearing aid is a behind-the-ear hearing aid, which is worn behind the pinna.

The hearing device is intended and configured to be worn on the human body. In other words, the hearing device preferably contains a holding apparatus, by means of which fastening on the human body is possible. If the hearing device is a hearing aid, the hearing device is intended and configured for example to be arranged behind the ear or inside an auditory canal. In particular, the hearing device is wireless and is intended and configured to be inserted at least partially into an auditory canal.

The hearing device contains, for example, a microphone which is used to register sound. Ambient sound in particular, or at least a part thereof, is registered by means of the microphone during operation. The microphone is, in particular, an electromechanical sound transducer. The microphone has for example only a single microphone unit, or a plurality of microphone units which interact with one another. Each of the microphone units expediently has a diaphragm, which is set in vibration with the aid of sound waves, the vibrations being converted into an electrical signal by means of a corresponding pickup device, such as a magnet which is moved in a coil. By means of the respective microphone unit, it is therefore possible to register an audio signal that is based on the sound impinging on the microphone unit. The microphone units are, in particular, configured to be unidirectional. The microphone is expediently arranged at least partially inside a case of the hearing device, and is therefore at least partially protected.

Expediently, the hearing device has a receiver for delivering an output signal. The output signal is, in particular, an electrical signal. The receiver is an electromechanical sound transducer, preferably a loudspeaker. Depending on the configuration of the hearing device, in the intended operating state the receiver is arranged at least partially inside an auditory canal of a wearer of the hearing device, that is to say a person, or is at least acoustically connected thereto. The hearing device is primarily used in particular to deliver the output signal by means of the receiver, corresponding sound being generated. In other words, the primary function of the hearing device is preferably to deliver the output signal. The output signal is in this case, in particular, generated at least partially as a function of the sound registered by means of the microphone.

The hearing device expediently contains a signal processor, which advantageously forms a signal processing unit or at least is a constituent thereof. The signal processor is for example a digital signal processor (DSP), or is produced by means of analog component parts. By means of the signal processor, adaptation of the (audio) signal generated by means of the optional microphone is carried out, in particular, preferably as a function of any hearing loss of a wearer of the hearing device. Expediently, an A/D converter is arranged between the microphone and the signal processing unit, for example the signal processor, if the signal processor is configured as a digital signal processor. The signal processor is, in particular, adjusted as a function of a parameter set. By means of the parameter set, a gain in different frequency ranges is in this case specified, so that the signal generated by means of the microphone is processed according to particular specifications, in particular as a function of a hearing loss of the wearer of the hearing device. Particularly preferably, the hearing device additionally contains an amplifier, or the amplifier is at least partially formed by means of the signal processor. For example, the amplifier is connected upstream or downstream of the signal processor in terms of signal technology.

The hearing device has a printed circuit board, on which a battery module is fastened. In particular, the printed circuit board is configured to be rigid, and is preferably manufactured from a glass fiber-reinforced epoxy resin. Conductive traces, which are preferably made of a copper, are expediently fastened on the epoxy resin or embedded therein. In particular, the battery module is fastened on at least one of the conductive traces, preferably soldered thereto. In this way, no further components are needed for fastening the battery module. Alternatively thereto or in combination therewith, additional fastening elements are provided, for example clips or domes, by means of which the battery module is held on the printed circuit board. The robustness is therefore increased.

Preferably, further electrical and/or electronic component parts of the hearing device are also fastened on the printed circuit board, for example the optional amplifier and/or other constituents of the optional signal processing unit. Particularly preferably, the hearing device has just this printed circuit board as the only printed circuit board. In this way, the number of components required and the required installation space are reduced, and manufacture of the hearing device is simplified.

In particular, powering of the individual component parts of the hearing device is carried out by means of the battery module during operation of the hearing device. In other words, an energy storage unit of the hearing device, which is used for operation, is provided by means of the battery module. Expediently, the battery module is the only energy storage unit of the hearing device. In particular, powering of the optional microphone/receiver or other component parts of the hearing device is therefore carried out by means of the battery module during operation of the hearing device.

The battery module has a battery cell with a case. The case is used to protect the other component parts of the battery cell, which are expediently arranged inside the case. Preferably, the case forms the outer boundary of the battery cell. The battery cell expediently contains electrodes and/or an electrolyte. For example, the electrolyte is liquid or configured as a solid body. Particularly preferably, the battery cell is a solid-state battery. Preferably, the electrodes/electrolyte are arranged directly inside the case and there is no other component between them. At least, however, the shielding of the electrodes/electrolytes from the surroundings is essentially carried out by means of the case, so that emergence of the individual constituents of the battery cell and/or an undesired reaction thereof with the surroundings is avoided by means of the case. Since no other components are present, the energy density of the battery cell is increased and the weight is reduced. In particular, the battery cell is configured as a lithium ion battery cell and/or as a secondary battery. In other words, the battery cell is configured to be rechargeable and is expediently fastened inseparably on the printed circuit board. In this way, the robustness is increased and the design is simplified.

The battery module furthermore has an antenna, which is integrated into the case. In other words, the antenna is fastened on the case and connected inseparably thereto, so that separation of the antenna is not possible. For example, the antenna is located inside the case, or particularly preferably outside the case, the antenna being for example fastened inseparably on its outer side so that integration is carried out in this way. The antenna is used in particular to establish a radio link of the hearing device with further devices and is suitable, in particular intended and configured, therefor. Expediently, the hearing device contains a radio apparatus which, in the assembled state, is connected to the antenna in terms of signal technology. During operation, signals are transmitted and/or received via the antenna by means of the radio apparatus, and for this purpose the radio apparatus, which is a communication instrument or at least is used as such, has in particular a transceiver. In particular, the radio apparatus is operated according to a particular standard, such as a WLAN, Bluetooth and/or mobile telephony standard. At least, however, the antenna is expediently suitable for a corresponding standard and therefore for the transmission/reception of (radio) signals in the corresponding frequency ranges.

Because of the integration of the antenna into the case, there is a stable connection between them and it is not necessary to fasten the antenna separately on the printed circuit board. In this way, assembly is simplified and the robustness is increased. Furthermore, it is not necessary to provide additional installation space on the printed circuit board for the antenna, so that in this way the overall size of the printed circuit board and therefore also of the hearing device is reduced.

For example, the printed circuit board has a plug-in location onto which the battery module is plugged. The battery module is therefore fastened separately on the printed circuit board. Preferably, however, the battery module is connected inseparably to the printed circuit board. Particularly preferably, the battery module is configured as a surface-mounted device (SMD). In other words, the battery module is fastened on the printed circuit board in particular by means of a reflow method or by means of soldering in a wave or swell bath. By virtue of such a configuration, the overall size of the battery module is further reduced and assembly is further simplified. In particular, the battery module has pads which are introduced into the case. The pads are located in particular on the side of the case facing toward the printed circuit board and in the assembled state bear on the printed circuit board, and are respectively soldered at least to one of the conductive traces. By means of the pads, electrical contacting of the further constituents of the battery cell, in particular the electrodes, with the printed circuit board takes place, so that input and/or output of electrical energy takes place via the pads. Preferably, the fastening of the battery module on the printed circuit board is carried out by means of the pads. In this way, the electrical contacting takes place in one working step together with the fastening, and automated manufacturing is made possible.

For example, one or more terminals of the battery module are electrically connected to the antenna, these protruding laterally beyond the case and, in the assembled state, being plugged into corresponding reception sockets, which for example are fastened on the printed circuit board. Particularly preferably, however, a terminal pad that is electrically connected to the antenna is introduced into the case. The terminal pad is located in particular on the side of the case facing toward the printed circuit board, and advantageously bears on the printed circuit board in the assembled state. The terminal pad is preferably soldered to, or at least electrically contacted with, one of the conductive traces of the printed circuit board. Expediently, the electrical contacting is carried out in the same working step as that in which the electrical contacting of the battery cell with the printed circuit board is carried out. The number of working steps required is therefore reduced and assembly is simplified. The number of components needed is also reduced. In other words, the contacting of the antenna is likewise carried out by means of surface mounting. The robustness is therefore further increased and assembly is simplified. Also, no additional components are required. Particularly preferably, two such terminal pads are introduced into the case, the antenna being arranged electrically between the terminal pads. Operation of the antenna is therefore simplified.

For example, the case is manufactured from a plastic. Particularly preferably, however, the case has a metal base body inside which the further constituents of the battery cell are arranged. Preferably, the case is configured to be rigid. In this way, shielding of the further constituents of the battery cell from external electric fields is also carried out by means of the base body. Furthermore, the robustness is increased in this way. The optional terminal pad(s) and/or pad(s) are in particular arranged in recesses of the base body. There is preferably an electrical insulator, such as a plastic, between the terminal pads/pads and the base body, so that on the one hand an electrical short circuit is prevented. On the other hand, in this way the case, namely the base body, is configured to be fluid-tight so that the robustness is increased. Alternatively, the terminal pad or pads are applied onto a surface of the base body, in particular via an insulator.

The antenna is fastened on the base body. In this way, the fastening of the antenna on the further constituents of the battery module is comparatively robust. For example, the antenna is configured at least partially as a wire or flat conductor, which is wound around the case. Preferably, an insulator is initially applied externally onto the base body, for example fully or partially. The antenna is fastened on the insulator. An electrical short circuit is therefore prevented. The insulator and/or the antenna are for example applied onto the base body by means of coating, casting or printing.

Particularly preferably, the base body has a slit-shaped opening which is closed by means of the antenna. In this way, fluid-tightness of the base body is furthermore provided, so that the further constituents of the battery cell are protected securely. For example, the entire opening is filled by means of the antenna. Particularly preferably, however, the antenna is arranged inside the opening at a distance from further constituents of the base body, and an insulator, in particular a plastic, is preferably arranged between the edge of the opening and the antenna. An electrical short circuit through the base body is therefore avoided. Alternatively thereto, the antenna has for example a different electrical conductivity than the base body. For example, the slit is configured to be rectilinear or preferably meandering. In this way, the length of the antenna is relatively large while the circumference of the base body may be selected to be relatively small.

For example, the case, or at least the optional base body, is configured to be cylindrical, the base face being for example round. Particularly preferably, however, the case is square. In this way, position holding as well as assembly are simplified. Particularly preferably, each edge length is less than 2 cm, 1.5 cm or 1 cm. In particular the edge length of at least one of the edges is less than 7 mm. Preferably, the edge length is more than 1 mm, 2 mm or 4 mm. By virtue of such a selection for the length of the edges, the case has a relatively small overall size so that use inside the hearing device is simplified. The battery cell nevertheless does have a relatively high capacity, so that operation of the hearing device for a long time is also possible.

For example, only the antenna is present. In an alternative thereto, the hearing device has a further antenna. In this case, the further interna is used for example for communication on a different frequency band/with a different standard than the antenna. Particularly preferably, however, the further antenna is electrically connected to the antenna, so that the further antenna and the antenna form a combined antenna that has an increased effective length. For example, the further antenna is formed by means of a coil. Particularly preferably, however, the further antenna is formed by means of a conductive trace of the printed circuit board. In this way, the number of components required is reduced. For example, the conductive trace is configured to be at least partially meandering. Preferably, the further conductive trace is electrically contacted with the optional radio apparatus/radio instrument, so that excitation of the antenna and/or checking of excitation of the antenna is carried out by means of the further antenna.

Other features which are considered as characteristic for the invention are set forth in the appended claims.

Although the invention is illustrated and described herein as embodied in a hearing device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Parts that correspond to one another are provided with the same references in all the figures.

Figure 1:
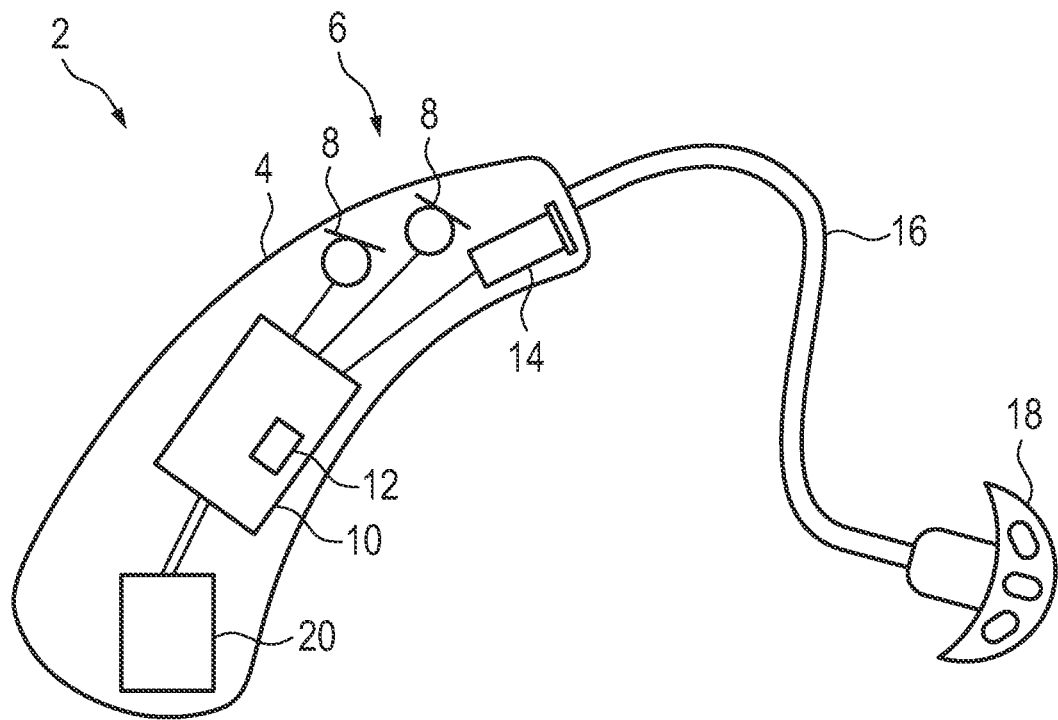
FIG. 1 is an illustration showing a hearing device.

Referring now to the figures of the drawings in detail and first, particularly to FIG. 1 thereof, there is shown schematically a hearing device 2 in the form of a hearing aid, which is intended and configured to be worn behind an ear of a wearer (operator, hearing device wearer, user). In other words, it is a behind-the-ear hearing aid. The hearing device 2 contains a device case 4, which is manufactured from a plastic. Arranged inside the device case 4, there is a microphone 6 with two microphone units 8, each in the form of an electromechanical sound transducer, which are configured to be omnidirectional. By modifying a time offset between the acoustic signals registered by means of the omnidirectional microphone units 8, it is possible to modify a direction characteristic of the microphone 6 so that a directional microphone is produced.

The two microphone units 8 are coupled in terms of signal technology with a signal processing unit 10, which comprises an amplifier circuit (not shown in detail) and a signal processor 12. The signal processing unit 10 is furthermore formed by means of circuit elements, for example electrical and/or electronic components. The signal processor 12 is a digital signal processor (DSP) and is connected in terms of signal technology to the microphone units 8 by means of an A/D converter (not represented in detail).

A receiver 14 is coupled in terms of signal technology with the signal processing unit 10. By means of the receiver 14, which is an electromechanical sound transducer, an (electrical) signal provided by means of the signal processing unit 10 is converted during operation into output sound, that is to say into sound waves. These are introduced into a sound tube 16, one end of which is fastened on the device case 4. The other end of the sound tube 16 is enclosed by means of a dome 18 which, in the intended operating state, is arranged in an auditory canal (not represented in detail) of the wearer of the hearing device 2.

The powering of the signal processing unit 10 is carried out by means of a battery module 20 arranged in the device case 4. From the signal processing unit 10, a part of the electrical energy is sent to the microphone 6 as well as the receiver 14.

Figure 2:
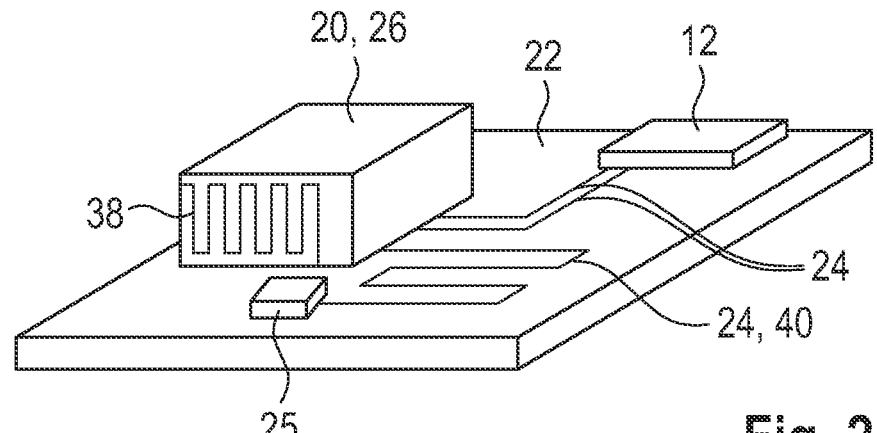
FIG. 2 is a simplified perspective view of a printed circuit board of the hearing device, on which a battery module is fastened.

FIG. 2 schematically represents a simplified detail of a printed circuit board 22, which is manufactured from a glass fiber-reinforced epoxy resin, of the hearing device 2. A plurality of conductive traces 24 made of a copper, only three of which are represented here, are attached on a surface of the epoxy resin body provided in this way. The signal processor 12 is fastened on the printed circuit board 22, specifically on some of the conductive traces 24. For this purpose, the signal processor 12 is soldered on the latter by means of SMD technology, specifically by a reflow method. Fastened on the same side of the printed circuit board 22 as the signal processor 12, there is the battery module 20 which is likewise electrically contacted with some of the conductive traces 24, by means of which the powering of the signal processor 12 is also carried out. A radio apparatus 25, which is an integrated circuit that is likewise configured as a surface-mounted device, is furthermore fastened on this side of the printed circuit board 22. Further electrical and/or electronic components (not illustrated in more detail) are also soldered on the printed circuit board 22, so that the printed circuit board 22 is used to provide the electrical circuit of the hearing device 2. In other words, the printed circuit board 22 is a constituent of the electrical circuit, and apart from this the hearing device 2 does not have a further printed circuit board.

The battery module 20 has a case 26, which is configured to be square. In this case, the length of four pairwise parallel edges is equal to 1 cm and the length of the remaining edges is 0.5 cm. The case 26 has a metal base body 28, which is likewise configured to be square and by means of which the outer shape of the case 26 is substantially defined.

Figure 3:
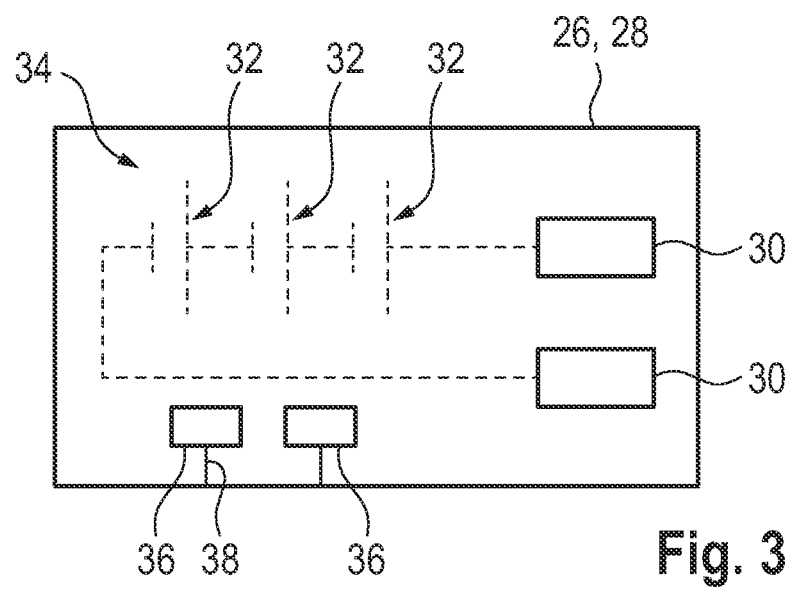
FIG. 3 is a bottom plan view of the battery module.

FIG. 3 schematically shows the lower side of the base body 28, and therefore also the lower side of the case 26, in a simplified way. In the assembled state, the lower side faces toward the printed circuit board 22, and for example bears thereon at least in sections. Two pads 30 made of a metal, such as copper, are introduced into the lower side of the case 26. For this purpose, the base body 28 has two recesses, inside each of which one of the pads 30 is arranged. The gap existing between the edge of each recess and the corresponding pad 30 is filled with an electrical insulator, so that the pads 30 are electrically insulated from the base body 28 but are held securely thereon.

A plurality of galvanic cells 32, which are arranged inside the base body 28 and therefore inside the case 26, are electrically contacted with the pads 30. By the case 26 and the galvanic cells 32, a battery cell 34 of the battery module 20 is substantially formed, by means of which cell the powering of the signal processing unit 10 is carried out. In the assembled state, each of the pads 30 is electrically contacted respectively with at least one of the conductive traces 34, this likewise having been carried out by a reflow method, that is to say by SMD technology.

Furthermore, two terminal pads 36 are applied onto the same side of the square base body 28 and are fastened inseparably thereon, so that the terminal pads 36 are introduced into the case 26. The terminal pads 36 are fastened on the base body 28 via an electrical insulator (not represented in detail). An antenna 38, which extends between the two terminal pads 36, is electrically connected to the terminal pads 36. The antenna 38 is guided geometrically from the lower side of the square base body 28 onto at least one of the sides of the base body 28 which run perpendicularly to the printed circuit board 22. There, the shape of the antenna 38 is meandering.

In the assembled state, the two terminal pads 36 are likewise soldered on the printed circuit board 22 by means of a reflow method, which is carried out in the same working step as that in which the pads 30 are soldered to the printed circuit board 22. In this working step, the signal processor 12, the radio apparatus 25 as well as the optional further constituents are also soldered to the printed circuit board 22. In summary, the battery module 20 is therefore a surface-mounted device/component.

One of the terminal pads 36 is electrically contacted with one of the conductive traces 24 of the printed circuit board 22, which is likewise configured to be meandering, so that a further antenna 40 is thereby formed. By means of the further antenna 40, the antenna 38 is electrically contacted with the radio apparatus 25. A combined antenna, which has a relatively large length, is therefore formed by means of the further antenna 40 and the antenna 38. In summary, the further antenna 40 is electrically connected to the antenna 38 and is formed by means of one of the conductive traces 24.

During operation, excitation of the further antenna 40 as well as of the antenna 38 is carried out by means of the radio apparatus 25, so that radio signals can be transmitted by means of them. They satisfy a particular standard, such as a Bluetooth standard. In an operating mode temporally offset therefrom, reception of radio signals is carried out by means of the antenna 38 and the further antenna 40, by means of which they are excited. These radio signals also satisfy the standard. The excitation of the two antennas 38, 30 is registered by means of the radio apparatus 25, so that the radio signals are registered. With the aid of the radio signals, for example, a functionality of the signal processor 12 is modified.

Figure 4:
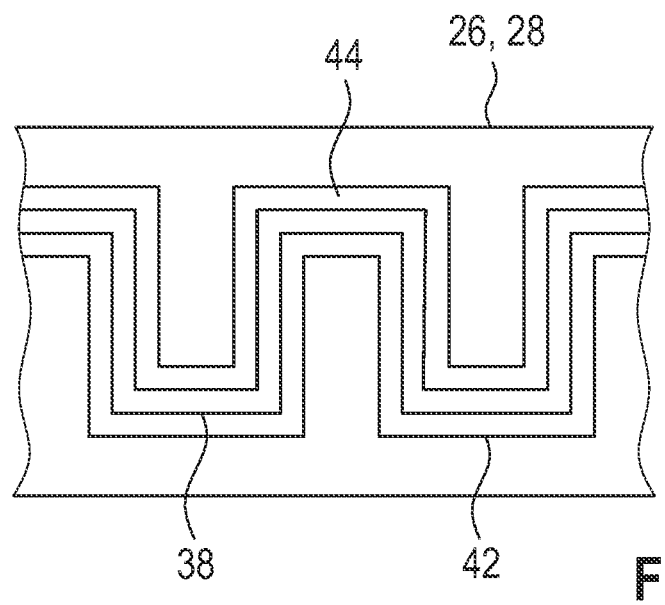
FIG. 4 is a side view of a simplified detail of a case of the battery module.

FIG. 4 represents a side view of a detail of the case 26 with the square base body 28. The base body 28 has a slit-shaped opening 42, which is configured to be meandering. Arranged inside the opening 42, there is the antenna 38 which is configured in the shape of a strip and follows the profile of the opening 42, the antenna being at a distance from the edge of the opening 42. The region between the antenna 38 and the edge of the opening 42 is filled by means of an insulator 44 made of a plastic. The insulator 44 is produced by means of an injection-molding method, and the antenna 38 is therefore molded onto the base body 28. The base body 28 is therefore configured to be fluid-tight, and ingress of ambient air into the case 26 is avoided.

In one variant which is not represented in detail, the base body 28 is configured to be uninterrupted, and therefore does not have the opening 42. In this case, for example, the insulator 44 is molded onto the surface of the base body 28 so that the antenna 38 is thereby held firmly and inseparably on the base body 28. In summary, the antenna 38 is integrated into the case 26 of the battery cell 34 in all embodiments. The electrical contacting of the antenna 38 is carried out in the same working step as that in which the battery cell 34 is electrically contacted with the printed circuit board 22 and is fastened thereon, specifically by means of surface mounting.

The invention is not restricted to the exemplary embodiment described above. Rather, other variants of the invention may also be derived therefrom by a person skilled in the art, without departing from the subject matter of the invention. In particular, all individual features described in connection with the exemplary embodiment may furthermore be combined with one another in a different way, without departing from the subject matter of the invention.

The following is a summary list of reference numerals and the corresponding structure used in the above description of the invention.

LIST OF REFERENCES 2 hearing device
4 device case
6 microphone
8 microphone unit
10 signal processing unit
12 signal processor
14 receiver
16 sound tube
18 dome
20 battery module
22 printed circuit board
24 conductive trace
25 radio apparatus
26 case
28 base body
30 pad
32 galvanic cell
34 battery cell
36 terminal pad
38 antenna
40 further antenna
42 opening
44 insulator

The invention claimed is:

1. A hearing device, comprising:
a battery module having a battery cell with a case, said case having a metal base body with a slit-shaped opening formed therein, said battery cell having electrodes and an electrolyte disposed directly within said case, with no further component being present between said electrodes and said electrolyte;
a printed circuit board on which said battery module, which has said battery cell with said case, is fastened; and
an antenna being integrated into said case, said antenna being non-detachably fastened on said metal base body, said split-shaped opening being closed by means of said antenna.

2. The hearing device according to claim 1, wherein said battery module is configured as a surface-mounted device.

3. The hearing device according to claim 2, further comprising a terminal pad, which is electrically connected to said antenna, is introduced into said case.

4. The hearing device according to claim 1, wherein said case is square.

5. The hearing device according to claim 1, wherein said printed circuit board has a further antenna, which is formed by means of a conductive trace and is electrically connected to said antenna.

6. The hearing device according to claim 1, wherein said slit-shaped opening is entirely filled by means of said antenna ensuring a fluid-tightness of said metal base body.

* * * * *